United States Patent
Otremba et al.

(10) Patent No.: US 8,975,117 B2
(45) Date of Patent: Mar. 10, 2015

(54) SEMICONDUCTOR DEVICE USING DIFFUSION SOLDERING

(75) Inventors: Ralf Otremba, Kaufbeuren (DE); Fong Lim, Melaka (MY); Abdul Rahman Mohamed, Muar (MY); Chooi Mei Chong, Gopeng (MY); Ida Fischbach, Munich (DE); Xaver Schloegel, Sachsenkam (DE); Juergen Schredl, Mering (DE); Josef Hoeglauer, Kirchheim-Heimstetten (DE)

(73) Assignee: Infineon Technologies AG, Neubiberg (DE)

( * ) Notice: Subject to any disclaimer, the term of this patent is extended or adjusted under 35 U.S.C. 154(b) by 431 days.

(21) Appl. No.: 13/369,059

(22) Filed: Feb. 8, 2012

(65) Prior Publication Data
US 2013/0200532 A1 Aug. 8, 2013

(51) Int. Cl.
*H01L 21/00* (2006.01)
*H01L 21/44* (2006.01)

(52) U.S. Cl.
USPC ........... 438/118; 438/123; 438/612; 438/614; 257/E21.508; 257/E21.509; 257/E21.614

(58) Field of Classification Search
None
See application file for complete search history.

(56) References Cited

U.S. PATENT DOCUMENTS

| | | | |
|---|---|---|---|
| 7,615,478 B2 * | 11/2009 | Salmon | 438/612 |
| 7,898,080 B2 * | 3/2011 | Otremba | 257/732 |
| 2005/0048758 A1 | 3/2005 | Hosseini et al. | |
| 2012/0208323 A1 | 8/2012 | Heinrich et al. | |
| 2013/0010446 A1 * | 1/2013 | Henrik et al. | 361/783 |
| 2013/0021766 A1 * | 1/2013 | Mahler et al. | 361/772 |
| 2013/0044322 A1 * | 2/2013 | Feitisch et al. | 356/432 |

FOREIGN PATENT DOCUMENTS

| | | |
|---|---|---|
| DE | 19930190 A1 | 3/2001 |
| DE | 103 39 462 A1 | 3/2005 |
| WO | 03072288 A1 | 9/2003 |

* cited by examiner

*Primary Examiner* — Mohsen Ahmadi
(74) *Attorney, Agent, or Firm* — Slater & Matsil, L.L.P.

(57) ABSTRACT

A method includes providing a semiconductor chip having a first main surface and a second main surface. A semiconductor chip is placed on a carrier with the first main surface of the semiconductor chip facing the carrier. A first layer of solder material is provided between the first main surface and the carrier. A contact clip including a first contact area is placed on the semiconductor chip with the first contact area facing the second main surface of the semiconductor chip. A second layer of solder material is provided between the first contact area and the second main surface. Thereafter, heat is applied to the first and second layers of solder material to form diffusion solder bonds between the carrier, the semiconductor chip and the contact clip.

15 Claims, 10 Drawing Sheets

SEMICONDUCTOR DEVICE USING DIFFUSION SOLDERING

TECHNICAL FIELD

This invention relates to the technique of mounting a semiconductor chip on a carrier, and, in particular embodiments, to the technique of diffusion soldering.

BACKGROUND

Semiconductor device manufacturers are constantly striving to increase the performance of their products, while decreasing their cost of manufacture. A cost intensive area in the manufacture of semiconductor devices is packaging the semiconductor chips. As those skilled in the art are aware, integrated circuits are fabricated on wafers, which are then singulated to produce semiconductor chips. Subsequently, the semiconductor chips may be mounted on electrically conductive carriers, such as leadframes. Packaging methods providing high yield at low expenses are desirable.

For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF ILLUSTRATIVE EMBODIMENTS

In the following detailed description, reference is made to the accompanying drawings, which form a part thereof, and in which is shown by way of illustration specific embodiments in which the invention may be practiced. In this regard, directional terminology, such as "top," "bottom," "front," "back," "leading," "trailing," etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

Devices containing semiconductor chips are described below. In particular, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure has electrodes on its two main surfaces, that is to say on its top side and bottom side.

In particular, power semiconductor chips may be involved. Power semiconductor chips may have a vertical structure. The vertical power semiconductor chips may, for example, be configured as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. By way of example, the source electrode and gate electrode of a power MOSFET may be situated on one main surface, while the drain electrode of the power MOSFET is arranged on the other main surface. The semiconductor chips need not be manufactured from specific semiconductor material, for example, Si, SiC, SiGe, GaAs, and, furthermore, may contain inorganic and/or organic materials that are not semiconductors. The semiconductor chips may be of different types and may be manufactured by different technologies.

The semiconductor chips may have contact pads (or electrodes or contact elements) which allow electrical contact to be made with the integrated circuits included in the semiconductor chips. The contact pads may include one or more metal layers which are applied to the semiconductor material of the semiconductor chips. The metal layers may be manufactured with any desired geometric shape and any desired material composition. The metal layers may, for example, be in the form of a layer covering an area. Any desired metal capable of forming a diffusion solder bond, for example, Cu, Ni, NiSn, Au, Ag, Pt, Pd, and an alloy of one or more of these metals may be used as the material. The metal layers need not be homogenous or manufactured from just one material, that is to say various compositions and concentrations of the materials contained in the metal layers are possible.

Solder material may be applied to electrically and mechanically connect the semiconductor chip to a carrier and/or a contact clip to the semiconductor chip and/or the contact clip to a lead of the carrier. Any solder material capable of forming diffusion solder bonds may be used, for example, solder material comprising one or more of Sn, SnAg, SnAu, In, InAg, and InAu. Further, the solder material may be free of Pb.

In particular, if the solder material comprises Sn, the solder material may comprise a content of Sn greater than 80%, 90% or even 95%. The solder material may also comprise a content of 100% of Sn.

The solder material may comprise metal particles of a diameter between 1 and 30 μm, more particularly between 5 and 10 μm.

Figure 1A:
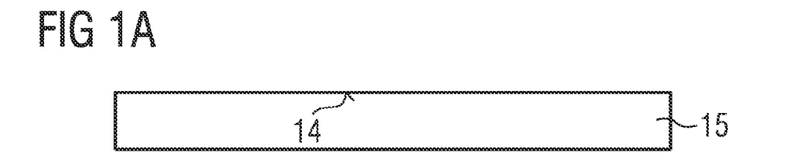
FIGS. 1A-1D schematically illustrate a cross-sectional view of one embodiment of a method of mounting a semiconductor chip to a carrier.

FIGS. 1A-1D schematically illustrate a method for mounting a semiconductor chip on a carrier in accordance with one embodiment. FIG. 1A schematically illustrates a carrier 15. The carrier 15 may, e.g., be die pad of a leadframe, a PCB (Printed Circuit Board), a DCB (Direct Copper Bond), which is a ceramic substrate with copper layers on its top and bottom surface, etc. The carrier 15 is made of or has an upper surface 14 made of any desired metal capable of forming a diffusion solder bond, for example, Cu, Ni, NiSn, Au, Ag, Pt, Pd, or an alloy of one or more of these metals.

Figure 1B:
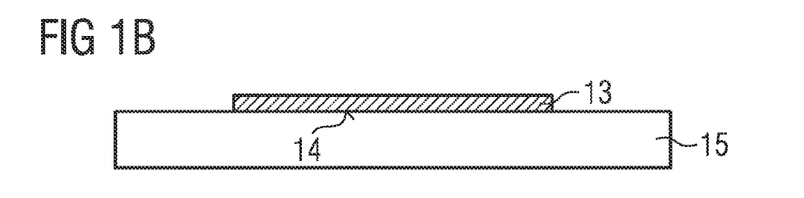

In FIG. 1B, a first layer of solder material 13 is deposited on the upper surface 14 of the carrier 15. The first layer of the solder material 13 may be made of any of the solder materials mentioned above.

In one embodiment, the first layer 13 of solder material is deposited by using a sputtering process. In this case, the deposition rate is set to such a value that a desired amount or layer thickness of deposited solder material is obtained.

In one embodiment, the first layer 13 of solder material may be deposited by an electrochemical deposition process. For that purpose, a solution containing solder particles is applied to the carrier 15, and an appropriate voltage is applied between the carrier 15 and a reference electrode such that the solder particles deposit on the upper surface 14 of the carrier 15.

In one embodiment, the first layer 13 of solder material may be deposited by printing or dispensing a solder material paste on the upper surface 14 of the carrier 15. The solder material paste may contain metal particles as mentioned above. Further, it may contain a flux material. It may be free of any organic solvent known in the art to be used to separate the metal particles.

Figure 1C:
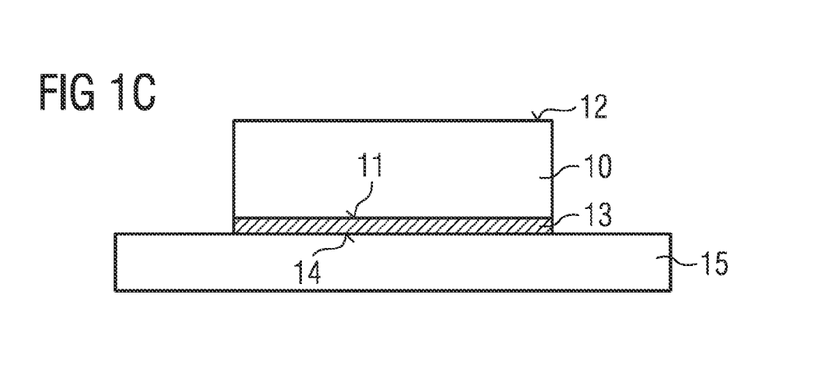

FIG. 1C schematically illustrates a semiconductor chip 10 that is placed on the carrier 15 with a first main surface 11 of the semiconductor chip 10 facing the carrier 15 and a second main surface 12 facing away from the carrier 15. The first layer 13 of solder material is arranged between the first main surface 11 of the semiconductor chip 10 and the upper surface 14 of the carrier 15. A first chip electrode (not shown) may be arranged at the first main surface 11 of the semiconductor chip 10 opposite to and in abutment with the first layer 13 of solder material.

Figure 1D:
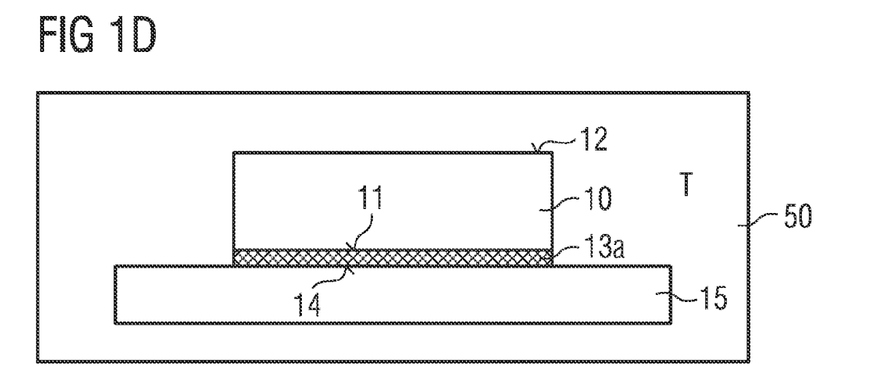

FIG. 1D schematically illustrates that the solder material is heated to a temperature T in order to attach the semiconductor chip 10 to the carrier 15 firmly. Heating is accomplished in a furnace 50.

In one embodiment, the maximum temperature applied by the furnace 50 to the solder material may, e.g., be between 250° C. and 350° C., more particularly, e.g., between 270° C. and 320° C.

In one embodiment, the staying time during which the solder material is located in the furnace is between 30 seconds and 300 seconds, more particularly between 60 s and 120 s.

In one embodiment, no external pressure is applied to the arrangement shown in FIG. 1D during its stay in the furnace 50. That is, only gravity controls the force or pressure applied to the first layer 13 of solder material when exposed to the high temperature in the furnace 50.

During the stay in the furnace 50 the first layer 13 of solder material transforms into a first diffusion solder bond layer 13a. More specifically, the solder material starts melting at a melting temperature. By way of example Sn has a melting temperature of 232° C. The solder material is exposed to a temperature T which is higher than the melting temperature of the solder material. An intermetallic phase is formed in the first layer 13 of solder material by diffusion. At the end of the stay time in the furnace 50, all the solder material of the first layer 13 has completely transformed, i.e., it has passed completely into the intermetallic phase. The first diffusion solder bond layer 13a produced that way is made of this intermetallic phase. It is able to withstand high temperatures, is highly mechanically stable and exhibits a high electrical and thermal conductivity.

It is to be noted that the temperature T and the furnace staying time may be chosen based on the thickness of the first diffusion solder bond layer 13a to be produced (i.e., the amount of solder material deposited on the carrier 15) and on the kind of the metal materials used for creating the intermetallic phase (i.e., the metal material at the upper surface 14 of the carrier 15 and the metal material of the electrode of the semiconductor chip 10). In one embodiment, the thickness of the first diffusion solder bond layer 13a is equal or smaller than, e.g., 10 μm, more particularly 5 μm. Further, in one embodiment, the materials used at both sides of the first layer 13 of solder material for creating the intermetallic phase are the same material. In this case, the diffusion processes occurring at both sides of the first layer 13 of solder material during transition to the first diffusion solder bond layer 13a have the same diffusion rate.

Figure 2A:
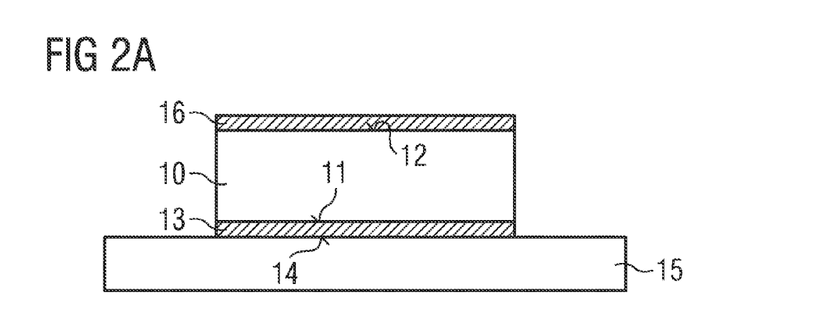
FIGS. 2A-2C schematically illustrate a cross-sectional view of one embodiment of a method of mounting a semiconductor chip to a carrier and a contact clip to the semiconductor chip.
Figure 2B:
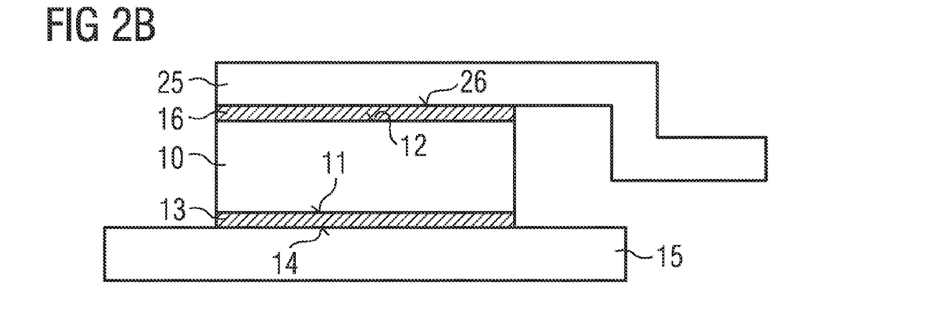
Figure 2C:
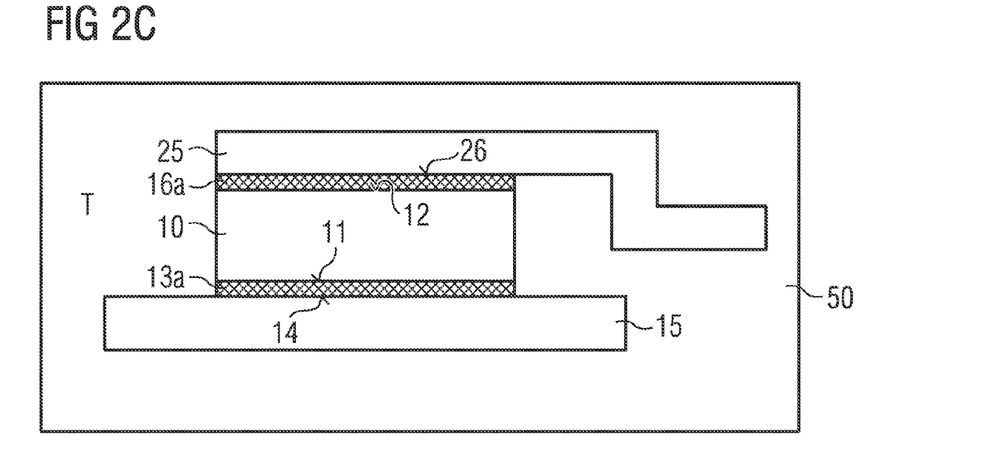

FIGS. 2A-2C exemplify stages of a process of mounting a semiconductor chip 10 to a carrier 15 and a contact clip 25 onto the semiconductor chip 10. Aspects of the process described in conjunction with FIGS. 2A-2C may be combined with processes described in the aforementioned embodiment, and vice versa.

First, the process steps referred to in conjunction with FIGS. 1A-1C may be accomplished. Then, starting with the arrangement shown in FIG. 1C, a second layer 16 of solder material may be deposited on a second main surface 12 of the semiconductor chip 10, as shown in FIG. 2A. A second chip electrode (not shown) may extend at the second main surface 12 of the semiconductor chip 10, and the second layer 16 of solder material may be placed on this second chip electrode.

The solder material of the second layer 16 of solder material may be identical to the solder material of the first layer 13 of solder material. Further, the same processes as described for applying the first layer 13 of solder material may be used to deposit the second layer 16 of solder material onto the second main surface 12 of the semiconductor chip 10. It is to be noted that the first layer 13 of solder material has not been transformed to a diffusion solder bond layer 13a when depositing the second layer 16 of solder material.

In FIG. 2B a contact clip 25 is placed over the semiconductor chip 10. The contact clip 25 may have a first contact area 26. The contact clip 25 is placed such that the first contact area 26 is placed over the second layer 16 of solder material. The contact clip 25 or, at least, the first contact area 26 of the contact clip 25 may be made of any desired metal capable of forming a diffusion solder bond, for example, Cu, Ni, NiSn, Au, Ag, Pt, Pd, or any alloy of one or more of these metals.

The contact clip 25 may be a lead connecting to or forming an external terminal of a semiconductor device. By way of example, the contact clip 25 may be a lead of a leadframe and the carrier 15 may be a die pad of the leadframe. As will be described in more detail further below, in other embodiments the contact clip may be a conducting element bridging between the second chip electrode and an external terminal (such as, e.g., a lead of a leadframe) of the semiconductor device.

In FIG. 2C the arrangement shown in FIG. 2B is introduced into a furnace 50. In the furnace 50 the solder material of the first layer 13 of solder material and of the second layer 16 of solder material are heated to the temperature T. The furnace process used in FIG. 2C may be the same as described with reference to FIG. 1D, and reference is made to the corresponding description in order to avoid reiteration. In particular, no external pressure may applied to the arrangement shown in FIG. 2C during its stay in the furnace 50, i.e., the force or pressure applied to the first layer 13 of solder material and to the second layer 16 of solder material, when exposed to the high temperature in the furnace 50, is only controlled by gravity.

During the stay in the furnace 50 the first layer 13 of solder material and the second layer 16 of solder material concurrently transform into the first diffusion solder bond layer 13a and a second diffusion solder bond layer 16a, respectively. All disclosure related to the first diffusion bond layer 13a may identically apply for the second diffusion bond layer 16a, and reference is made to the corresponding disclosure for the sake brevity. In particular, the same solder materials may be used for the first layer 13 and the second layer 16 of solder material, and the second diffusion solder bond layers 16a may have a thickness in the same range as or identical to the thickness of the first diffusion solder bond layer 13a.

Figure 3A:
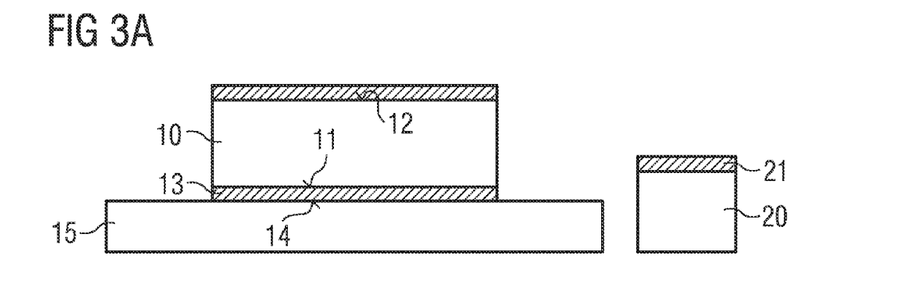
FIGS. 3A-3C schematically illustrate a cross-sectional view of one embodiment of a method of mounting a semiconductor chip to a carrier and a contact clip to the semiconductor chip and a lead.
Figure 3B:
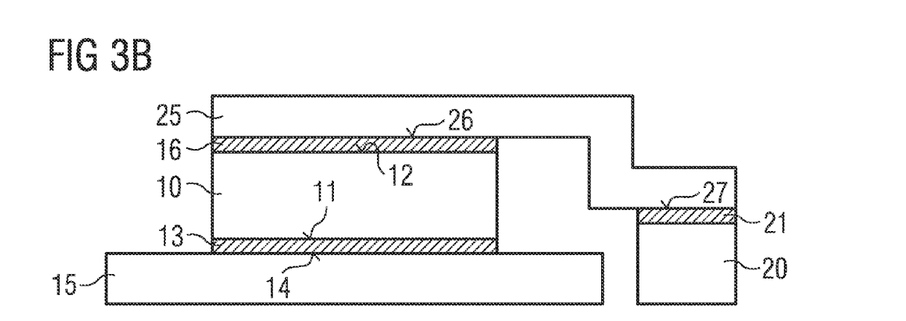
Figure 3C:
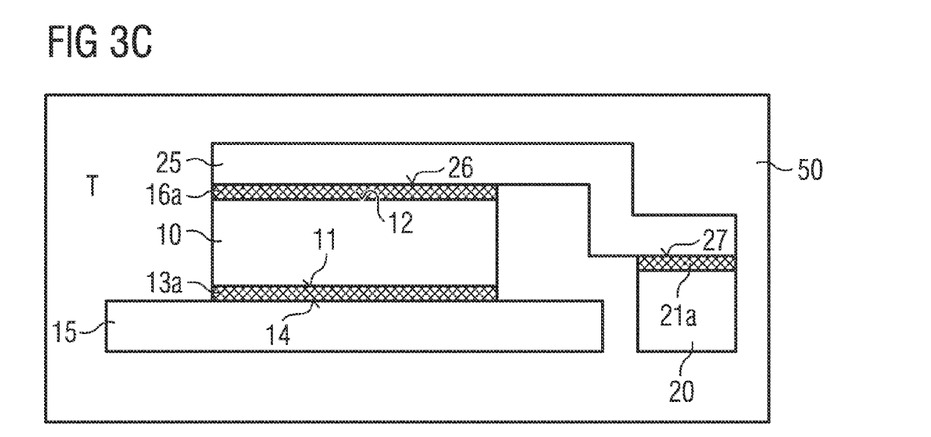

FIGS. 3A-3C exemplify stages of a process of mounting a semiconductor chip 10 to a carrier 15 and a contact clip 25 onto the semiconductor chip 10. Aspects of other embodiments described herein may be combined with the process described in conjunction with FIGS. 3A-3C, and vice versa.

In FIG. 3A a lead 20 is provided. The lead 20 may be a lead of a leadframe wherein, in this case, the carrier 15 may be a die pad of the leadframe. A third layer 21 of solder material has been deposited on an upper surface of the lead 20. All disclosures relating to the first and second layers 13, 16 of solder material similarly apply to the third layer 21 of solder material. In particular, the solder material of the third layer 21 of solder material may be deposited on the lead 20 by the same techniques as described above, and the solder material may be the same as used in the first and second layers 13, 16 of solder material. Further, the thickness of the third layer 21 of solder material may be in the same range as or identical to the thickness of the first or second layers 13, 16 of solder material, respectively.

In FIG. 3B the contact clip 25 is placed on the semiconductor chip 10 and the lead 20. The contact clip 25 has a second contact area 27 opposite to and in abutment with the third layer 21 of solder material. The second contact area 27 may be comprised of the same material(s) as mentioned above in relation to the first contact area 26.

In FIG. 3C the arrangement shown in FIG. 3B is introduced into the furnace 50. The first, second and third layers 13, 16 and 21 of solder material are heated in the same way and processed in the furnace 50 as described above with reference to FIGS. 1D and 2C. In particular, again, no external pressure may be applied to the arrangement shown in FIG. 3C during the stay in the furnace 50, and a furnace staying time as mentioned above may be used. As a result, first, second and third diffusion solder bond layers 13a, 16a and 21a are generated. The contact clip 25 is firmly secured to the semiconductor chip 10 and to the lead 20 by the second and third diffusion solder bond layers 16a and 21a, respectively. All disclosure (e.g., material, thickness, etc.) in relation to the first and second diffusion solder bond layers 13a and 16a equivalently apply to the third solder bond layer 21a, and reiteration is avoided for the sake of brevity.

Figure 4:
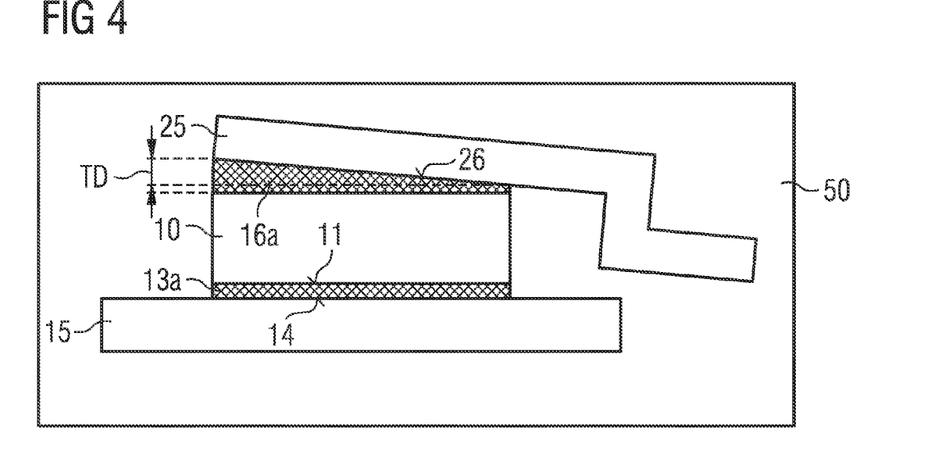
FIG. 4 schematically illustrates a cross-sectional view of one embodiment of a semiconductor chip mounted to a carrier and a contact clip attached to the semiconductor chip, with the contact clip being tilted.

As depicted in FIG. 4, the contact clip 25 may be tilted by a specific tilt distance TD relative to a plane defined by the second main surface 12 of the semiconductor chip 10. The tilt distance TD is defined by the difference in thickness of the second diffusion solder bond layer 16a when measured at a side adjacent to the outer end of the contact clip 25 (i.e., left side of FIG. 4) and when measured at an opposite side (i.e., right side of FIG. 4). In one embodiment the tilt distance TD is equal or smaller than, e.g., 10 μm, more particularly 5 μm. In other words, the small thickness of the second diffusion solder bond layer 16a guarantees that the maximum tilt of the contact clip 25 is also limited to small values. It is to be noted that the tilt distance illustrated in FIG. 4 equally applies for the embodiment illustrated in FIGS. 2A-2C and the embodiment illustrated in FIGS. 3A-3C.

Figure 5A:
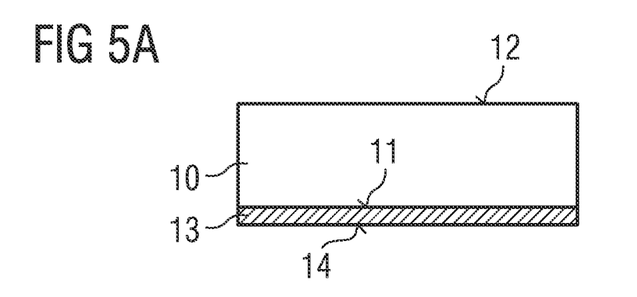
FIGS. 5A-5C schematically illustrate a cross-sectional view of one embodiment of a method of mounting a semiconductor chip to a carrier.
Figure 5B:
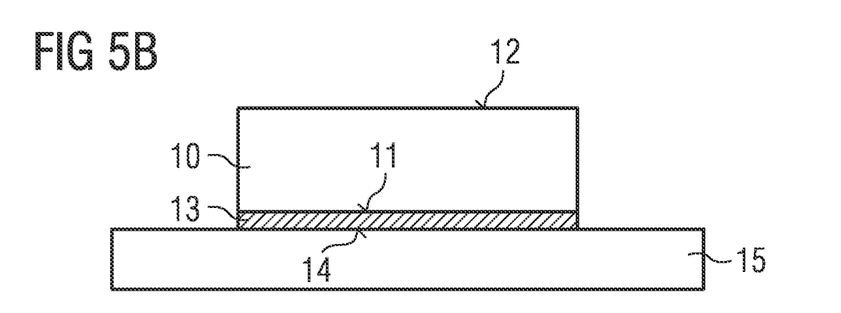
Figure 5C:
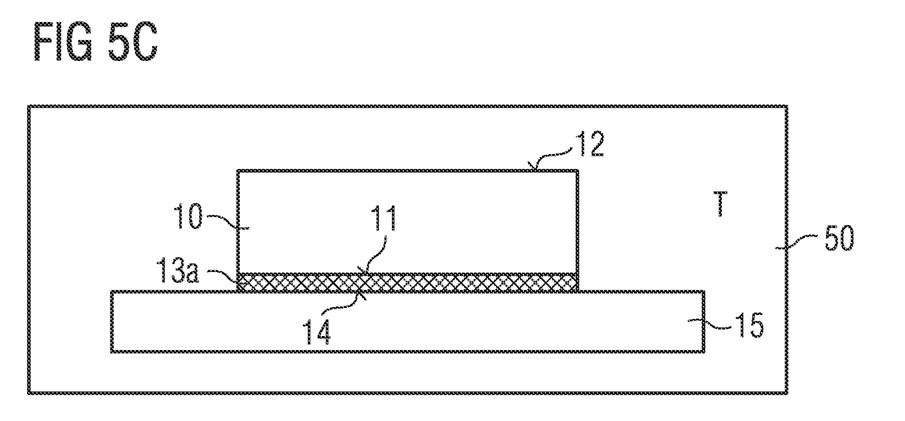

FIGS. 5A-5C schematically illustrate and exemplify a method for mounting a semiconductor chip 10 on a carrier 15. The method disclosed in FIGS. 5A-5C corresponds to the method described in conjunction with FIGS. 1A-1D with the exception that the first layer 13 of solder material is not deposited on the carrier 15 before placing the semiconductor chip 10 on the carrier but is deposited on the first main surface 11 of the semiconductor chip 10 (FIG. 5A) before the semiconductor chip 10 together with the first layer 13 of solder material is placed on the carrier 15. Apart from this difference the arrangement shown in FIG. 5B corresponds to the arrangement shown in FIG. 1C. The transition of the first layer 13 of solder material to the first diffusion solder bond layer 13a is performed in the furnace 50 and accomplished the same way as described in conjunction with FIG. 1D. For the sake of brevity, reference is made to the corresponding disclosure to avoid reiteration.

Analogously to the method illustrated in FIGS. 5A-5C, when a contact clip 25 is placed on and soldered to the semiconductor chip 10 and (optionally) the lead 20 as described above in conjunction with FIGS. 2A-4, the second layer 16 of solder material and/or the third layer 21 of solder material may first be deposited on the contact clip 25 before the contact clip 25 is placed on the semiconductor 10 and (optionally) the lead 20. Again, with the exception of this modification, such method of mounting a semiconductor chip 10 to a carrier 15 and a contact clip 25 onto the semiconductor chip 10 and (optionally) the lead 20 may be accomplished the same way as described above. Reiteration is omitted for the sake of brevity.

FIGS. 6A-9C exemplifies stages of manufacturing a semiconductor device in accordance with one embodiment. The disclosure below is, in some aspects, more detailed than the disclosure of the aforementioned embodiments. It is to be noted that details described in connection with FIGS. 6A-9C may be combined with the concepts and aspects described in the aforementioned embodiments. Vice versa, concepts and aspects disclosed in relation to the aforementioned embodiments may be combined with the disclosure of the embodiment explained with reference to FIGS. 6A-9C.

Figure 6A:
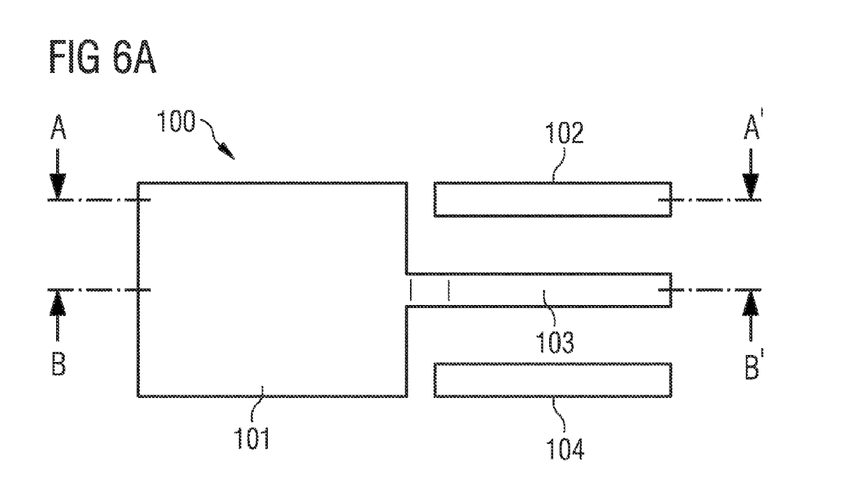
FIG. 6A schematically illustrates a top view of a leadframe in accordance with one embodiment of a method of manufacturing a semiconductor device.
Figure 6B:
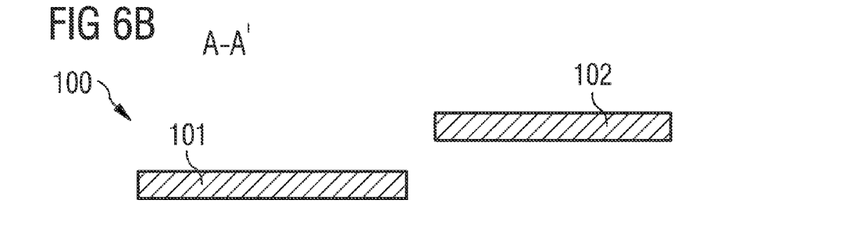
FIG. 6B schematically illustrates a cross-sectional view along line A-A' of FIG. 6A.
Figure 6C:
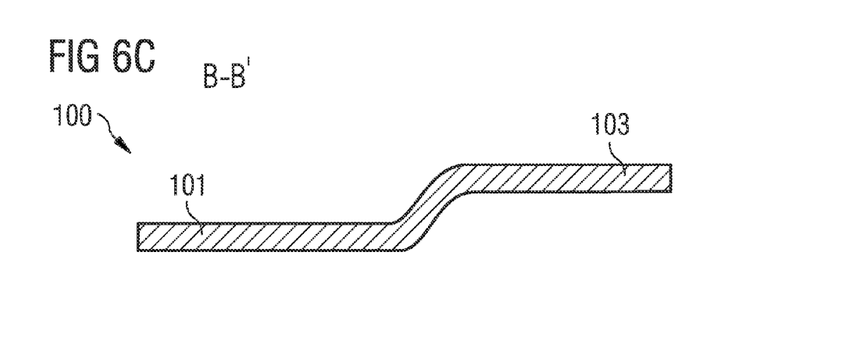
FIG. 6C schematically illustrates a cross-sectional view along line B-B' of FIG. 6A.

FIG. 6A schematically illustrates a leadframe 100. The leadframe 100 is illustrated in a plan view (FIG. 6A), a cross-sectional view along the line A-A' (FIG. 6B) and a cross-sectional view along the line B-B' (FIG. 6C). The leadframe 100 may include a die pad 101, a first lead 102, a second lead 103 and a third lead 104. The leads 102-104 protrude essentially in parallel from one side of the die pad 101. The second lead 103 may be continuous with one side of the die pad 101. The die pad 101 and the leads 102-104 may be linked by dams (tie bars), which are not illustrated in the figures for the sake of clarity. As illustrated in FIGS. 6B and 6C, the leads 102-104 may optionally be arranged in a different plane than the die pad 101, but may alternatively be arranged in the same plane.

In one embodiment the leadframe 100 may be a specific implementation of the carrier 15 and lead 20. More specifically, the die pad 101 may correspond to the carrier 15 and the first lead 102 may correspond to lead 20, and vice versa. The leadframe 100 may be made of the materials mentioned above. The leadframe 100 may have a thickness in the range from 100 μm to 1 mm or may be even thicker. The leadframe 100 may have been manufactured by punching, milling or stamping a metallic plate.

Figure 7A:
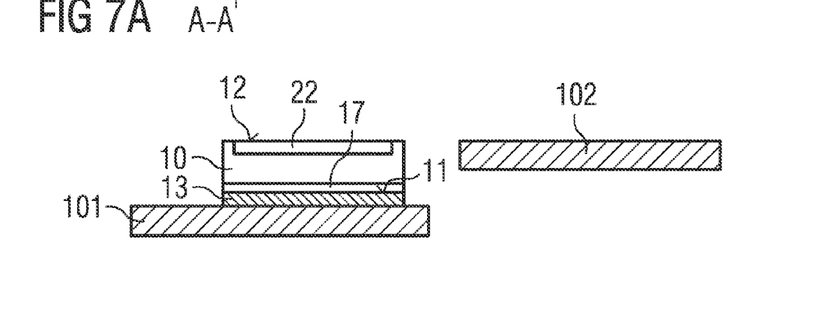
FIG. 7A schematically illustrates a cross-sectional view corresponding to FIG. 6B after placing a semiconductor chip on a leadframe in accordance with one embodiment of a method of manufacturing a semiconductor device.
Figure 7B:
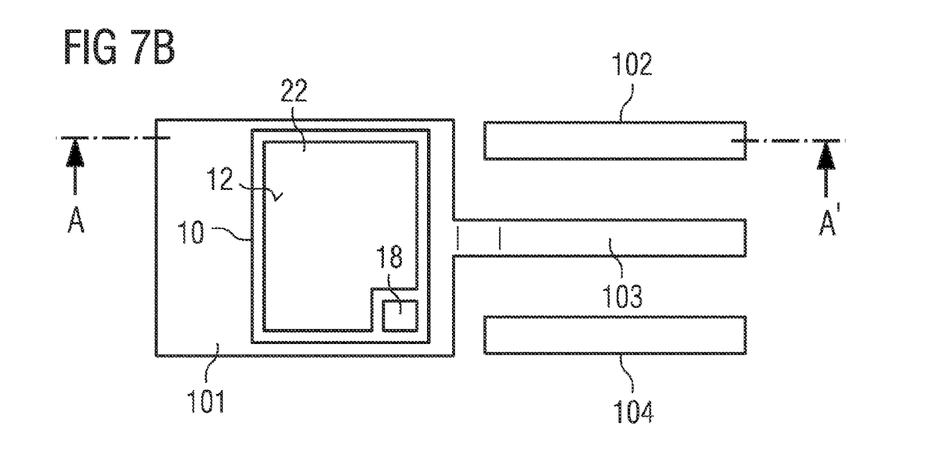
FIG. 7B schematically illustrates a top view of the arrangement as shown in FIG. 7A.

FIG. 7B schematically illustrates a semiconductor chip 10 which is a power semiconductor chip and is placed on the die pad 101. In one embodiment further power semiconductor chips may be placed on the same die pad 101 or on further die pads of the leadframe 100, which are not illustrated in FIG. 7B.

As shown in FIG. 7A, the semiconductor chip 10 is placed on the die pad 101 with its first main surface 11 facing the die pad 101. The semiconductor chip 10 may have a first electrode 17 on the first main surface 11 and a second electrode 22 on the second main surface 12. The first and second electrodes 17, 22 are load electrodes. Furthermore, the semiconductor chip 10 may have a third electrode 18, as shown in FIG. 7B, on its second main surface 12. The third electrode 18 may be a control electrode. The top surface of the die pad 101 may be larger than the first main surface 11 of the semiconductor chip 10.

The semiconductor chip 10 is configured as a power transistor, for example, a power MOSFET, IGBT, JFET or power bipolar transistor, or a power diode. In the case of a power MOSFET or a JFET, the first electrode 17 is a drain electrode, the second electrode 22 is a source electrode, and the third electrode 18 is a gate electrode. In the case of an IGBT, the first electrode 17 is a collector electrode, the second electrode 22 is an emitter electrode, and the third electrode 18 is a gate electrode. In the case of a power bipolar transistor, the first electrode 17 is a collector electrode, the second electrode 22 is an emitter electrode, and the third electrode 18 is a base electrode. In the case of a power diode, the first and second electrodes 17, 22 are anode and cathode, and there is no third electrode. During operation, voltages higher than 5, 50, 100, 500 or 1000 V may be applied between the first and second electrodes 17, 22.

As shown in FIG. 7A, prior to the heating process, a first layer 13 of solder material is arranged between the first electrode 17 and the die pad 101. Reference is made to the aforementioned embodiments to avoid reiteration.

Figure 8A:
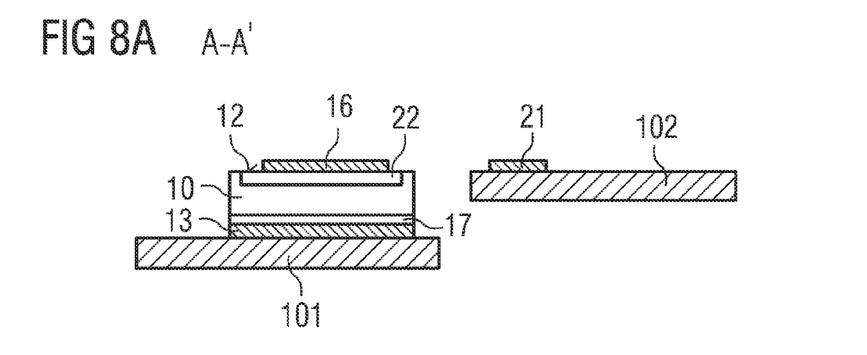
FIG. 8A schematically illustrates a cross-sectional view corresponding to FIG. 7A after depositing a solder material onto the semiconductor chip.
Figure 8B:
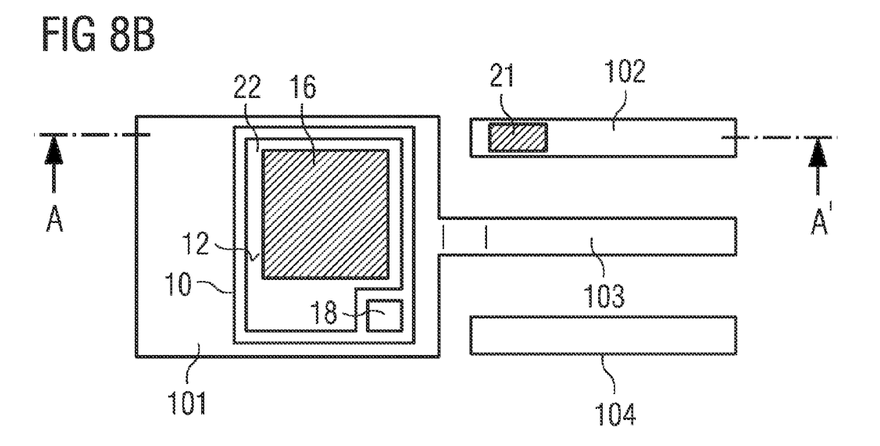
FIG. 8B schematically illustrates a top view of the arrangement as shown in FIG. 8A.

FIGS. 8A-8B schematically illustrate second and third layers 16, 21 of solder material which are deposited on at least portions of the second electrode 22 of the semiconductor chip 10 and the upper surface of the first lead 102, respectively. The second and third layers 16, 21 of solder material are deposited before the soldered joint between the die pad 101 and the semiconductor chip 10 has been formed. The second and third layers 16, 21 of solder material are deposited by using printing, dispensing or any other appropriate technique as mentioned before. The second and third layers 16, 21 of solder material may have a thickness equal or smaller than, e.g., 10 μm, more particularly 5 μm. In one embodiment, the second electrode 22 of the semiconductor chip 10 and/or the upper surface of the first lead 102 may be coated with a layer of nickel or copper or any other metal or metal alloy as mentioned above which allows to produce a soldered joint in a diffusion soldering process. In addition, a layer of silver or gold may be deposited on this layer, the layer of silver or gold having a thickness in the range from 10 to 200 nm. The silver or gold layer prevents the nickel or copper layer (or layer of any other metal mentioned above) from oxidation.

Figure 9A:
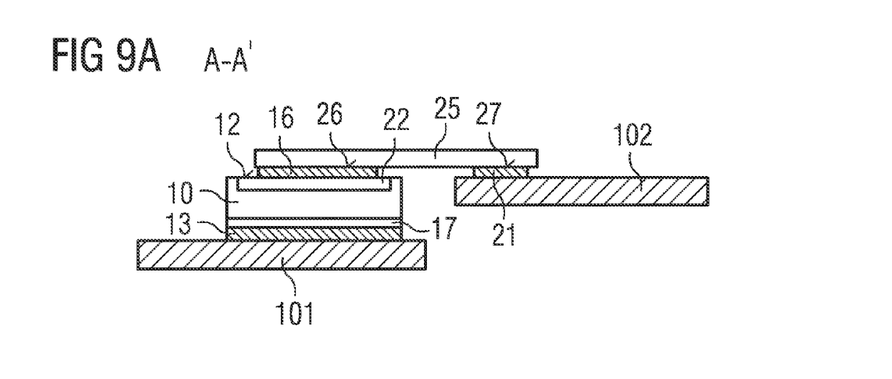
FIG. 9A schematically illustrates a cross-sectional view corresponding to FIG. 8A after placing a contact clip on the semiconductor chip.
Figure 9B:
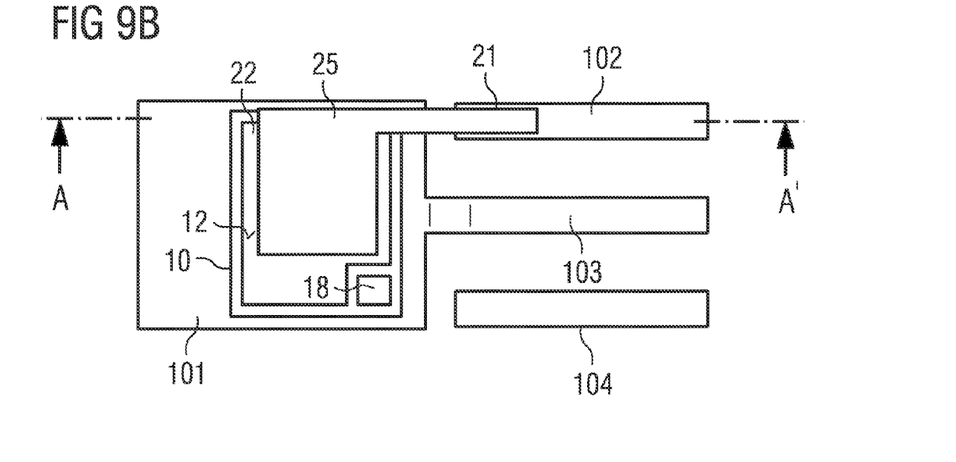
FIG. 9B schematically illustrates a top view of the arrangement as shown in FIG. 9A.

FIGS. 9A-9B schematically illustrate a contact clip 25 which is placed over the first lead 102 and the semiconductor chip 10. The contact clip 25 has a first contact area 26 which faces the second electrode 22 of the semiconductor chip 10 and a second contact area 27 which faces the first lead 102.

The contact clip 25 may be manufactured from a metal or a metal alloy as mentioned above. The shape of the contact clip 25 is not limited to any size or geometric shape. The contact clip 25 may have the shape as exemplarily illustrated in FIG. 9B, but any other shape is also possible. In one embodiment, the contact clip 25 has a thickness in the range from 100 to 200 μm. The contact clip 25 may be fabricated by stamping, punching, pressing, cutting, sawing, milling or any other appropriate technique. The first and second contact areas 26, 27 may be fabricated by stamping, punching, etching or any other appropriate technique. They may be coated with a layer of nickel or copper or any other metal or metal alloy as mentioned above which allows to produce a soldered joint in a diffusion soldering process. In addition, a layer of silver or gold may be deposited on this layer, the layer of silver or gold having a thickness in the range from 10 to 200 nm. The silver or gold layer prevents the nickel or copper layer (or layer of any other metal mentioned above) from oxidation.

Figure 9C:
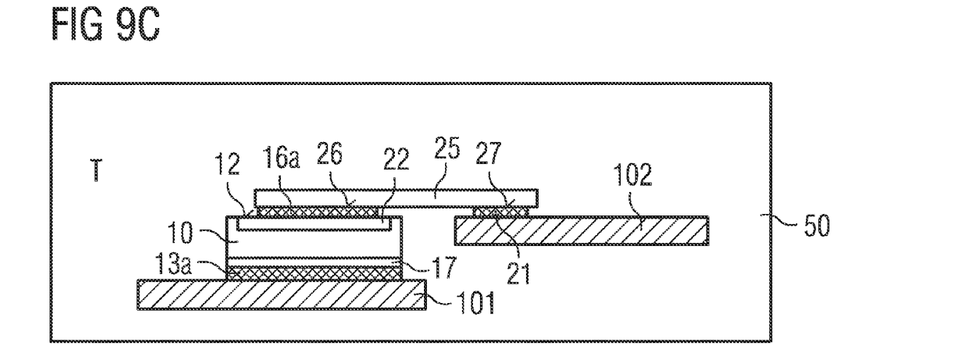
FIG. 9C schematically illustrates a cross-sectional view of the arrangement of FIG. 9A after being introduced in a furnace and formation of diffusion solder joints.

FIG. 9C schematically illustrates that the arrangement shown in FIGS. 9A-9B is introduced into the furnace 50 and the layers 13, 16 and 21 of solder material are simultaneously heated to a temperature T in order to transform the layers 13, 16 and 21 of solder material into respective diffusion solder bond layers 13a, 16a and 21a. The furnace process may be accomplished as described above, in particular in view of (no) external pressure application, furnace staying time, temperature, solder materials, methods of solder material deposition, and diffusion solder bond thickness.

Figure 10:
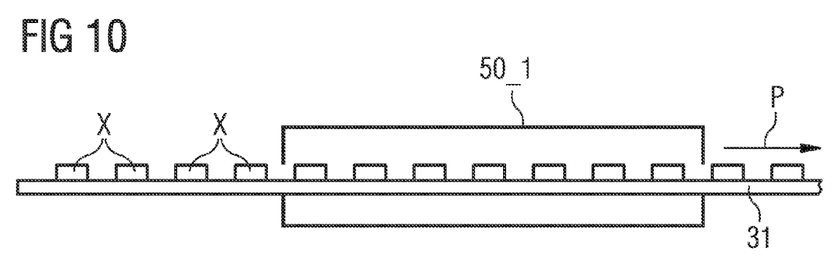
FIG. 10 illustrates a schematic view of an embodiment of a method for manufacturing a semiconductor device using a tunnel furnace.

FIG. 10 illustrates a furnace process in accordance with one embodiment. Carriers 15 together with the semiconductor chips 10 and, optionally, a contact clips 25, as, e.g., shown in FIGS. 1C, 2B, 3B, 5B, and 9A-9B, are referred to as arrangements X. Arrangements X are placed on a conveyor 31. The conveyor 31 may, for example, be driven by a step motor and moves the arrangements X in a direction indicated by arrow P in FIG. 10. After the placement of the arrangements X on the conveyor 31, the arrangements X pass through a tunnel furnace 50_1. In the tunnel furnace 50_1 the layers 13, 16, 21 of solder material are exposed to heat to obtain a maximum temperature T. The staying time of the arrangements X in the tunnel furnace 50_1 may either be controlled by the velocity of the conveyor 31 if a continuous process is used (i.e., the conveyor 31 is driven with a constant velocity) or by a time interval during which the conveyor is stopped in an intermittent operation, if a semi-continuous process is used. The staying time should be large enough to allow a complete transition of solder material into the intermetallic phase, and could, e.g., be between 30 s and 300 s, or, more specifically, between 60 s and 120 s.

Figure 11:
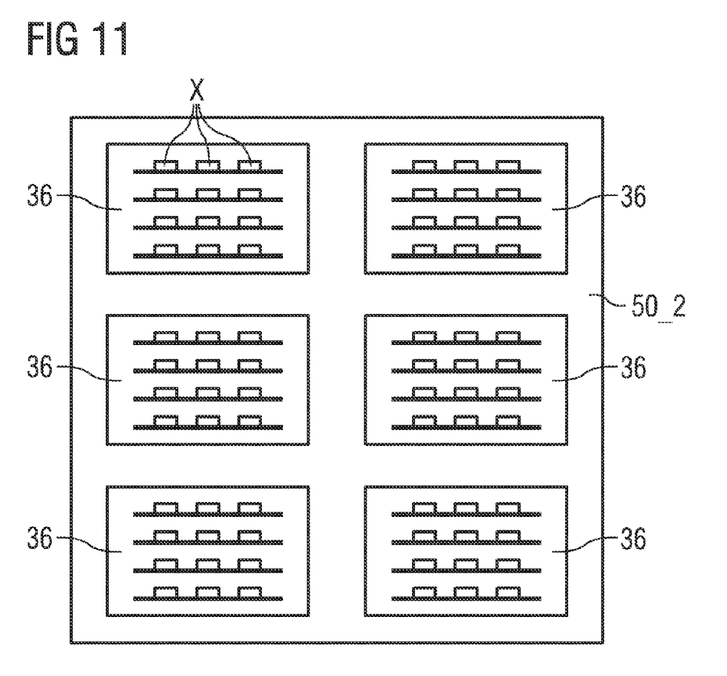
FIG. 11 illustrates a schematic view of an embodiment of a method for manufacturing a semiconductor device using a batch process in a furnace.

FIG. 11 illustrates a schematic view of a further furnace process used for soldering the arrangements X. Here, the arrangements X are placed in one or more magazines 36. Subsequently, the magazine 36 and possibly further magazines 36 are placed or introduced in a furnace 50_2. In furnace 50_2, similar to tunnel furnace 50_1, the layers 13, 16, 21 of solder material are exposed to heat to obtain a maximum temperature T. After elapse of the staying time as mentioned above, the one or more magazines 36 are removed from the furnace 50_2.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method comprising:
providing a semiconductor chip having a first main surface and a second main surface, wherein the second main surface comprises an electrode;
placing the semiconductor chip on a carrier with the first main surface of the semiconductor chip facing the carrier, wherein a first layer of solder material is provided between the first main surface and the carrier;
placing a contact clip comprising a first contact area on the semiconductor chip with the first contact area facing the second main surface of the semiconductor chip, wherein a second layer of solder material is provided between the first contact area and the electrode; and thereafter
applying heat to the first and second layers of solder material to form a first diffusion solder bond layer from the first layer of solder material and a second diffusion solder bond layer from the second layer of solder material, wherein applying heat comprises placing the carrier, the semiconductor chip and the contact clip in a furnace, wherein a maximum temperature applied by the furnace to the first and second layers of solder material is between 250° C. and 350° C., and wherein no external pressure is applied to the carrier, the semiconductor chip and the contact clip while in the furnace.

2. The method of claim 1, wherein the carrier comprises a leadframe.

3. The method of claim 1, wherein the semiconductor chip comprises a power semiconductor chip.

4. The method of claim 1, wherein the second diffusion solder bond layer has a thickness equal or less than 10 μm.

5. The method of claim 1, wherein a staying time during which the first and second layers of solder material are located in the furnace is between 30 seconds and 300 seconds.

6. The method of claim 1, wherein the first contact area of the contact clip and the electrode on the second main surface of the semiconductor chip are comprised of a same metal material.

7. The method of claim 6, wherein the metal material is one of Cu, Ni, NiSn, Au, Ag, Pt, Pd, or an alloy of one or more of these metals.

8. The method of claim 1, wherein the contact clip comprises a second contact area and the carrier comprises a lead, the method further comprising:
when placing the contact clip on the semiconductor chip, placing the second contact area on the lead, wherein a third layer of solder material is provided between the second contact area and the lead.

9. The method of claim 8, further comprising:
applying heat to the third layer of solder material to form a third diffusion solder bond layer concurrently with the application of heat to the first and second layers of solder material.

10. The method of claim 1, wherein the first and second layers of solder material each comprises metal particles of a diameter between 1 and 30μm.

11. The method of claim 1, wherein at least one of the first and second layers of solder material comprises a content of Sn greater than 80%.

12. The method of claim 1, wherein at least one of the first and second layers of solder material comprises one of Sn, SnAg, SnAu, In, InAg, and InAu.

13. A method comprising:
providing a carrier;
providing a contact clip fabricated by one or more of stamping, punching, pressing, cutting, sawing and milling;
applying a first solder deposit to the carrier;
placing a semiconductor chip on the first solder deposit;
applying a second solder deposit to the semiconductor chip;
placing the contact clip on the second solder deposit; and thereafter
applying heat to the first and second solder deposits to form diffusion solder bonds between the carrier, the semiconductor chip and the contact clip, wherein applying heat comprises placing the carrier, the semiconductor chip and the contact clip in a furnace, wherein a maximum temperature applied by the furnace to the first and second solder deposits is between 250° C. and 350° C., and wherein no external pressure is applied to the carrier, the semiconductor chip and the contact clip while in the furnace.

14. A method comprising:
providing a semiconductor chip having a first main surface and a second main surface, wherein the second main surface comprises an electrode;
placing the semiconductor chip on a carrier with the first main surface of the semiconductor chip facing the carrier, wherein a first layer of solder material is provided between the first main surface and the carrier;

placing a contact clip on the second main surface of the semiconductor chip, wherein a second layer of solder material is provided between the electrode and the contact clip; and placing the carrier and the semiconductor chip into a tunnel furnace to apply heat to the first and second layers of solder material to form a first diffusion solder bond between the carrier and the semiconductor chip and a second diffusion solder bond between the semiconductor chip and the contact clip, wherein a maximum temperature applied by the furnace to the first and second layers of solder material is between 250° C. and 350° C., and wherein no external pressure is applied to the carrier, the semiconductor chip and the contact clip while in the furnace.

15. The method of claim 14, wherein a staying time during which the first layer of solder material is located in the tunnel furnace is between 30 seconds and 300 seconds.

\* \* \* \* \*